United States Patent
Xiao et al.

(10) Patent No.: US 9,809,711 B2
(45) Date of Patent: Nov. 7, 2017

(54) CATALYST AND FORMULATIONS COMPRISING SAME FOR ALKOXYSILANES HYDROLYSIS REACTION IN SEMICONDUCTOR PROCESS

(71) Applicant: Air Products and Chemicals, Inc., Allentown, PA (US)

(72) Inventors: Manchao Xiao, San Diego, CA (US); Ronald Martin Pearlstein, San Marcos, CA (US); Richard Ho, Anaheim, CA (US); Xinjian Lei, Vista, CA (US); Steven Gerard Mayorga, Oceanside, CA (US); Daniel P. Spence, Carlsbad, CA (US)

(73) Assignee: VERSUM MATERIALS US, LLC, Allentown, PA (US)

( * ) Notice: Subject to any disclaimer, the term of this patent is extended or adjusted under 35 U.S.C. 154(b) by 784 days.

(21) Appl. No.: 13/738,482

(22) Filed: Jan. 10, 2013

(65) Prior Publication Data
US 2013/0180215 A1     Jul. 18, 2013

Related U.S. Application Data

(60) Provisional application No. 61/587,388, filed on Jan. 17, 2012, provisional application No. 61/706,809, filed on Sep. 28, 2012.

(51) Int. Cl.
| | | |
|---|---|---|
| C09D 1/00 | (2006.01) | |
| H01L 21/02 | (2006.01) | |
| B65B 1/04 | (2006.01) | |
| C08G 77/04 | (2006.01) | |

(52) U.S. Cl.
CPC ............... *C09D 1/00* (2013.01); *B65B 1/04* (2013.01); *C08G 77/04* (2013.01); *H01L 21/02126* (2013.01); *H01L 21/02216* (2013.01); *H01L 21/02282* (2013.01)

(58) Field of Classification Search
CPC .. C09D 1/00; B65B 1/04; C08G 77/04; H01L 21/02126
See application file for complete search history.

(56) References Cited

U.S. PATENT DOCUMENTS

| | | |
|---|---|---|
| 4,228,292 A | 10/1980 | D'Amico |
| 4,828,131 A | 5/1989 | Strubel |
| 5,386,050 A | 1/1995 | Jung et al. |
| 5,466,850 A | 11/1995 | Alty |
| 5,654,459 A | 8/1997 | Kropfgans et al. |
| 6,077,356 A | 6/2000 | Bouchard |
| 6,526,824 B2 | 3/2003 | Chase et al. |
| 7,074,690 B1 | 7/2006 | Gauri et al. |
| 7,124,913 B2 | 10/2006 | Birtcher et al. |
| 7,261,118 B2 | 8/2007 | Birtcher et al. |
| 7,498,273 B2 | 3/2009 | Mallick et al. |
| 7,582,555 B1 | 9/2009 | Lang et al. |
| 7,629,227 B1 | 12/2009 | Wang et al. |
| 7,888,233 B1 | 2/2011 | Gauri et al. |
| 7,915,131 B2 | 3/2011 | Nakagawa et al. |
| 7,915,139 B1 | 3/2011 | Lang et al. |
| 2005/0250918 A1* | 11/2005 | Hosaka et al. ............. 526/125.3 |
| 2006/0228903 A1 | 10/2006 | McSwiney |
| 2008/0207937 A1 | 8/2008 | Dawes |

(Continued)

FOREIGN PATENT DOCUMENTS

| | | |
|---|---|---|
| EP | 1928015 A2 | 6/2008 |
| GB | 653238 | 5/1951 |
| GB | 653238 A | 5/1951 |

(Continued)

OTHER PUBLICATIONS

Rokuro Okawara, Alkylalkoxypolysiloxanes. I. Ethylethoxypolysiloxanes, Bull. Chem. Soc. Japan, 1954, vol. 27 No. 7, pp. 429-430.
Rokuro Okawara, Alkylalkoxypolysilosanes. II. Ethylisopropoxypolysiloxanes, Bull. Chem. Soc. Japan, 1954, vol. 27, No. 9, pp. 582-584.
John L. Speier, The preparation and properties of (Hydroxyorgano)-silanes and related compounds, J. Am. Chem. Soc., vol. 74, 1952, pp. 1003-1005.
A. Benouargha et al, Redistribution of dichlorosilanes and dihydridosilanes. Synthesis of chloro hydridosilanes., Phosphorus, Sulfur, and Silicon, 1996, vol. 113, pp. 79-87.
Michael Knorr et al, Transition-metal silyl complexes, J. Organomet. Chem., vol. 365, 1989, pp. 151-161.
Ajaib S. Brar et al, Synthesis and reactivity of novel oligosilanes bearing functional carbosilane side chains, J. Organomet. Chem., vol. 628, 2001, pp. 262-270.

(Continued)

*Primary Examiner* — Alexander Polyansky
(74) *Attorney, Agent, or Firm* — Anne B. Kiernan; Michael K. Boyer; Rosaleen P. Morris-Oskanian

(57) ABSTRACT

A stable formulation comprising a silicon containing precursor selected from an alkoxysilane, aryloxysilane, or alkylalkoxysilane and a catalyst compound comprising a haloalkoxyalkylsilane or haloaryloxyalkylsilane wherein the substitutents within the silicon-containing precursor and catalyst compound are the same are described herein. More specifically, the formulation comprises a silicon-containing precursor comprising an alkoxyalkylsilane or aryloxysilane having a formula of $Si(OR^1)_nR^2_{4-n}$ and a catalyst comprising haloalkoxyalkylsilane having a formula of $XSi(OR^1)_nR^2_{3-n}$; or a silicon-containing precursor comprising an alkoxysilane or aryloxysilane having a formula of $R^2_{3-p}(R^1O)_pSi{-}R^3{-}Si(OR^1)_pR^2_{3-p}$ and a catalyst comprising a haloalkoxyalkylsilane or haloaryloxyalkylsilane having a formula of $(R^1O)_mR^2_{2-m}(X)Si{-}R^3{-}Si(OR^4)_2R^5$ wherein at least one or all of the $R^1$ and $R^2$ substituents are the same in both the silicon-containing precursor and catalyst compound are described herein. The formulations can be used in semiconductor deposition process, such as for example, a flowable silicon oxide process.

26 Claims, No Drawings

(56) References Cited

U.S. PATENT DOCUMENTS

2009/0105395 A1    4/2009   Kamata et al.

FOREIGN PATENT DOCUMENTS

| | | |
|---|---|---|
| JP | 63081132 | 12/1988 |
| JP | H06263426 A | 9/1994 |
| JP | 2002293529 A | 10/2002 |
| JP | 2013155150 | 8/2013 |
| TW | 200900467 A | 1/2009 |
| WO | 2007125785 A1 | 4/2007 |
| WO | 2012167060 A2 | 12/2012 |

OTHER PUBLICATIONS

Albert F. Reilly et al, Studies in silico-organic compounds. XIII. Additional chemical properties of . . . , J. Organic Chem., vol. 16 No. 3, 1951, pp. 387-390.

C.C. Chappelow et al, Synthesis of t-Butylsilicon compounds by the Wurtz-Fittig Reaction, vol. 27 No. 4, 1962, pp. 1409-1414.

Y. Hagiwara, et al, Alkoxysilylated-Derivatives of Double-Four-Ring Silicate as Novel Building Blocks of Silica-Based Materials, Chem. Mater., 2008, 1147-1153.

D. Mochizuki, et al, Formation of a New Crystalline Silicate Structure by Grafting Dialkoxysilyl Groups on Layered Octosilicate, J. Am. Chem. Soc., 2002, 12082-12083.

R. Wakabayashi, et al, Nonhydrolytic Synthesis of Branched Alkoxysiloxane Oligomers Si[OSiH(OR)2]4 (R=Me, Et), Angew. Chem. Int. Ed., 2010, 5273-5277.

S.C. Pace, et al, Redistribution Equilibria of fluorinated derivatives of elements in group IV, J. Organometallic Chem., 56, 1973, pp. 141-157.

G.V. Odabashyan, et al, J. Gen. Chem., USSR (Engl. Transl.) vol. 38, nb. 10, 1968, p. 2331. (abstract).

* cited by examiner

CATALYST AND FORMULATIONS COMPRISING SAME FOR ALKOXYSILANES HYDROLYSIS REACTION IN SEMICONDUCTOR PROCESS

CROSS-REFERENCE TO RELATED APPLICATIONS

This patent application claims the benefit of provisional patent application U.S. Ser. No. 61/587,388, entitled "Catalyst for Alkoxysilanes Hydrolysis Reaction in Semiconductor Process" filed Jan. 17, 2012 and provisional patent application U.S. Ser. No. 61/706,809, entitled "Catalyst for Alkoxysilanes Hydrolysis Reaction in Semiconductor Process" filed Sep. 28, 2012, which are both incorporated herein by reference in their entirety.

BACKGROUND OF THE INVENTION

Described herein is a process for the fabrication of an electronic device. More specifically, described herein are catalyst compounds, and pre-mixtures, mixtures, and formulations comprising same, that are used for an alkoxysilane hydrolysis reaction in a semiconductor deposition process, such as without limitation, in a flowable chemical vapor deposition of silicon oxide.

Alkoxysilane compounds are useful as precursors for silicon-containing films (such as silicon oxide films) deposited by controlled hydrolysis and condensation reactions. Such films can be deposited onto a substrate, for example, by applying a mixture of water and alkoxysilanes, optionally with solvent and/or other additives such as surfactants and porogens, onto a substrate. Typical methods for the application of these mixtures include, without limitation, spin coating, dip coating, spray coating, screen printing, co-condensation, and ink jet printing. After application to the substrate and upon application of one or more energy sources such as, without limitation thermal, plasma, and/or other sources, the water within the mixture can react with the alkoxysilanes to hydrolyze the alkoxide and/or aryloxide groups and generate silanol species, which further condense with other hydrolyzed molecules and form an oligomeric or network structure.

Vapor deposition processes using water and a silicon containing vapor source for flowable dielectric deposition have been described, for instance, in U.S. Pat. Nos. 7,498,273; 7,074,690; 7,582,555; 7,888,233; and 7,915,131. Since the Si—C bond is relatively inert towards reaction with water, the resultant network may be beneficially functionalized with organic functional groups which impart desired chemical and physical properties to the resultant film. For example, the addition of carbon to the network may lower the dielectric constant of the resultant film.

Unfortunately, under certain deposition conditions, the hydrolysis and condensation reactions described above do not occur at a sufficiently fast rate to enable practical application of such precursors.

In processes where alkoxysilanes were synthesized, particularly when the synthesis was done by reacting a halosilane with an alcohol, crude complex mixtures that contain chlorosilane as an impurity in the desired product may form transiently. Such mixtures were never isolated nor made sufficiently pure under controlled conditions to be useful as an item of commerce.

The reference entitled "Alkoxysilated-Derivatives of Double-Four-Ring Silicate as Novel Building Blocks of Silica-Based Materials", Hagiwara, Y. et. al., Chem. Mater. 2008, 20, pp. 1147-1153 ("Hagiwara"), teaches alkoxysilylated-derivates of siloxane cage compounds having a double-four-ring unit and their use as building blocks for xerogels or mesostructured films (Hagiwara at pg. 1148). For this purpose, the authors teach the synthesis and reactivity of dimethylethoxychlorosilane ($Me_2(EtO)SiCl$), methyldiethoxychlorosilane ($Me(EtO)_2SiCl$), and triethoxychlorosilane ($Si(EtO)_3SiCl$), respectively (id.). Hagiwara further teaches that "[t]he reaction relies on the much higher reactivity of Si—Cl groups than the Si—OEt groups; therefore, the Si—Cl groups preferentially react with the Si—OH (or O—) groups of silicate species (id; citing the reference entitled "Formation of a New Crystalline Silicate Structure by Grafting Dialkoxysilyl Groups on Layered Octosilicate", Mochizuki, D., et al., J. Am. Chem. Soc., 2002, 124, 12082-12083 ("As the silylating reagent, we used dialkoxydichlorosilane, $(RO)_2SiCl_2$, R=alkyl. Although both Si—OR and Si—Cl groups are reactive, the reaction rate of Si—Cl groups is much higher than that of Si—OR groups.")). In Hagiwara, methyldiethoxychlorosilane (($Me(EtO)_2SiCl$) was synthesized by combining $MeSiCl_3$ with ethanol. After removing species containing more than two Si—Cl groups under reduced pressure, the reaction mixture contained approximately 30% of the silylating agent $MeSi(OEt)_3$ with the bulk of the material being $Me(EtO)_2SiCl$ as evidenced by NMR (id.).

GB Pat. No. 653238 ("GB '238") teaches a process for interchanging the alkoxy and chlorine substituents of silanes to form silanes having both chlorine and alkoxy substituents on the same silicon atom. GB '238 teaches that the alkoxy chlorosilane reaction products may contain functionally inert monovalent alkyl or aryl radicals attached to the silicon atom through a carbon linkage in addition to the alkoxy and chlorine substituents (e.g., $(CH_3)_2Si(OC_2H_5)Cl$, $C_6H_5CH_3Si(OCH_3)Cl$, $(C_2H_5)_2Si(OC_2H_5)Cl$, and $CH_3Si(OC_2H_5)_2Cl$) and silanes containing only alkoxy and chlorine substituents (e.g., $(C_2H_5O)_2SiCl_2$, $(CH_3O_2)SiCl_2$, and $(C_2H_5O)_3SiCl$) (see GB '238 on pg. 1, line 100 and pg. 2 lines 73-90). After separation of the reaction products, which is accomplished by fractional distillation, the alkoxy chlorosilanes may be condensed, without first being hydrolyzed, to form siloxanes (id.). Example 5 of GB '238 teaches the reaction of a mixture containing equimolar amounts of $CH_3Si(OC_2H_5)$ and $CH_3SiCl_3$ in the presence of HCl (which was contained in $CH_3SiCl_3$ as an impurity). After heating the mixture to 70° C., the mixture reacted to form $CH_3Si(OEt_2)Cl_2$ and $CH_3SiCl_2OEt$, which was 96.7% of theoretical.

U.S. Pat. No. 4,228,092 ("U.S. '092") teaches that the reaction of methyldichlorosilane ($CH_3SiCl_2H$) with methanol yielded a complex mixture of 92 percent methyldimethoxysilane with approximately 3 percent methylmethoxychlorosilane, approximately 4.7 percent methyltrimethoxysilane, and approximately 0.2 percent methyldimethoxychlorosilane (see U.S. '092 at col. 5, lines 57-67 through col. 6, lines 1-33). In example 3, U.S. '092 further teaches that reaction of ethanol with methyltrichlorosilane yields a crude mixture that is 97% methyltriethoxysilane and contains 1.8% methyldiethoxychlorosilane and 1% higher boiling point materials (id. at col. 8, lines 51-68 through col. 9, lines 1-4). This crude mixture was not isolated and was distilled to make substantively pure methyltriethoxysilane.

U.S. Pat. No. 7,629,227 ("U.S. '227) teaches a method for forming a flowable dielectric film that which involves a silicon-containing precursor and a catalyst selected from an ionizable species or a halosilane of formula $R_3SiX$ where R is independently selected from H, $C_1$-$C_5$ alkoxy and X is a halogen, amine or phosphine (see U.S. '227 at col. 6, lines 32-54). Examples of catalyst compounds include: $(CH_3O)_3SiCl$, $(CH_3CH_2O)_3SiCl$, $(CH_3O)_2Si(H)Cl$, $(CH_3CH_2O)_2Si(H)Cl$ and $(CH_3)_3SiN(H)Si(CH_3)_3$ (id.). These Si-containing catalyst compounds may also provide at least some of the silicon that reacts to form the flowable film and/or be mixed with the silicon-containing precursor (id.). The U.S. '227 patent also teaches an embodiment wherein a trimethoxysilane $((CH_3O)_3SiH)$ precursor with a certain percentage of Cl impurity (in the form of $(CH_3O)_2Si(H)Cl$) is used (id.). The U.S. '227 patent further teaches that its silicon-containing catalyst compound is not limited to use with its analogous non-halogenated form but may also be used with another silicon-containing precursor (e.g., $(CH_3O)_3SiCl$ may be the catalyst compound and TEOS the precursor) (id.).

Other chlorosilane species may also react with water rapidly to form hydrochloric acid in situ and could also serve as a catalyst for hydrolysis and condensation reactions. Unfortunately, alkoxychlorosilanes, alkoxysilanes and other similar compounds are known to undergo ligand exchange with each other, effectively scrambling the substituents on silicon. Under mild conditions, however, alkyl, aryl, substituted aryl, alkenyl and alkynyl substituents are largely immune to such scrambling.

Thus, there is still a need of a formulation comprising a silicon precursor and a suitable catalyst used for alkoxyalkylsilane hydrolysis reaction in semiconductor process such as flowable silicon oxide. In addition, there is a need of a formulation comprising a silicon-containing precursor and a catalyst compound that is selected to be mutually compatible with the silicon-containing precursor to provide a stable pre-mixture or formulation which can be stored, transported and delivered to an end user.

BRIEF SUMMARY OF THE INVENTION

Described herein is a stable formulation, which can be a premixture, preliminary formulation, or a formulation comprising a catalyst and a deposition or silicon-containing precursor. More specifically, the formulation comprises a silicon-containing precursor comprising an alkoxyalkylsilane or an aryloxyalkylsilane as the deposition precursor and a catalyst compound comprising a haloalkoxyalkylsilane or a haloaryloxyalkysilane. The silicon-containing precursor and catalyst compound are selected to provide a stable formulation by matching the alkoxy or aryloxy group(s) in the silicon-containing precursor with the alkoxy and aryloxy groups in the catalyst compound.

In one aspect, there is provided a formulation selected from the group consisting of:
(1) a Formulation A comprising:
(a) a silicon-containing precursor comprising an alkoxyalkylsilane having a formula of $Si(OR^1)_nR^2_{4-n}$; and (b) a catalyst comprising a haloalkoxyalkylsilane having a formula of $XSi(OR^1)_nR^2_{3-n}$; wherein $R^1$ is selected from the group consisting of a $C_1$-$C_{12}$ linear or branched alkyl group; a $C_3$-$C_{12}$ aryl group, a $C_3$-$C_{12}$ cycloalkyl group, a $C_2$-$C_{12}$ alkenyl group, and a $C_2$-$C_{12}$ alkynyl group; $R^2$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting of from F, Cl, Br and I; and (2) a Formulation B comprising:
(a) a silicon-containing precursor comprising a compound having a formula $R^2_{3-p}(R^1O)_pSi$—$R^3$—$Si(OR^1)_pR^2_{3-p}$ and (b) a catalyst comprising a haloalkoxyalkylsilane having a formula of $(R^1O)_mR^2_{2-m}(X)Si$—$R^3$—$Si(OR^4)_2R^5$; wherein $R^1$ and $R^4$ are each independently selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{5-10}$ cyclic alkenediyl group; a $C_{6-10}$ bi-cyclic alkanediyl group; a $C_{6-10}$ cyclic alkenediyl group; a $C_{6-10}$ arenediyl group; and $R^5$ is selected from a linear or branched $C_1$-$C_{12}$ alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive.

In a further aspect, there is provided a formulation, also described herein as Formulation A, comprising: a silicon-containing precursor comprising an alkoxyalkylsilane having a formula of $Si(OR^1)_nR^2_{4-n}$; and a catalyst comprising a haloalkoxyalkylsilane having a formula of $XSi(OR^1)_nR^2_{3-n}$; wherein $R^1$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from the group consisting of $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group, a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting of from F, Cl, Br and I. In one particular embodiment of Formulation A, $R^1$ in the silicon-containing precursor and $R^1$ in the catalyst compound are the same substituents. In this or other embodiments of Formulation A, both $R^1$ and $R^2$ in the silicon-containing precursor and both $R^1$ and $R^2$ in the catalyst compound are the same substituents.

In another aspect, there is provided a formulation, also described herein as Formulation B, comprising a silicon-containing precursor comprising an alkoxysilane compound having a formula $R^2_{3-p}(R^1O)_pSi$—$R^3$—$Si(OR^1)_pR^2_{3-p}$ and a catalyst comprising a haloalkoxysilane having a formula of $(R^1O)_mR^2_{2-m}(X)Si$—$R^3$—$Si(OR^4)_2R^5$; where $R^1$ and $R^4$ are each independently selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{5-10}$ cyclic alkenediyl group; a $C_{6-10}$ bi-cyclic alkanediyl group; a $C_{6-10}$ cyclic alkenediyl group; a $C_{6-10}$ arenediyl group and; $R^5$ is selected from a linear or branched $C_1$-$C_{12}$ alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive. In one particular embodiment, the alkoxysilane or the silicon-containing precursor can mean an alkoxyalkylsilane and the haloalkoxysilane can mean a haloalkoxyalkylsilane. In another embodiment, the alkoxysilane or the silicon-containing precursor can mean an aryloxyalkylsilane and the haloalkoxysilane can mean a haloalkoxyarylsilane. In one particular embodiment of Formulation B, $R^1$ in the silicon-containing precursor and $R^1$ in the catalyst are the same substituents in both compounds. In this or other embodiments of Formulation B, both of $R^1$ and $R^2$ in the silicon-containing precursor and all of $R^1$, $R^2$, $R^4$, and $R^5$ in the catalyst are the same substituents in both compounds.

In another aspect, there is provided a method of depositing a silicon containing film on a substrate comprising:
a) providing a substrate to a reaction chamber;
b) introducing a process fluid comprising a silicon-containing
precursor and a catalyst compound to the reaction chamber; and
c) exposing the substrate to the process fluid under conditions such that a condensed flowable film forms on the substrate surface;
wherein the process fluid is selected from the group comprising:
(i) Formulation A comprising: (a) the silicon-containing precursor comprising an alkoxyalkylsilane having a formula of $Si(OR^1)_n R^2_{4-n}$; and (b) the catalyst compound comprising a haloalkoxyalkylsilane having a formula of $XSi(OR^1)_n R^2_{3-n}$; wherein $R^1$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group, a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting of from F, Cl, Br and I; and
(ii) Formulation B comprising: (a) the silicon-containing precursor comprising a compound having a formula $R^2_{3-p}(R^1O)_p Si—R^3—Si(OR^1)_p R^2_{3-p}$ and (b) the catalyst compound comprising a haloalkoxysilane having a formula of $(R^1O)_m R^2_{2-m}(X)Si—R^3—Si(OR^4)_2 R^5$; where $R^1$ and $R^4$ are each independently selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{5-10}$ cyclic alkenediyl group; a $C_{6-10}$ bi-cyclic alkanediyl group; a $C_{6-10}$ cyclic alkenediyl group; a $C_{6-10}$ arenediyl group and; $R^5$ is selected from a $C_1$-$C_{12}$ linear or branched alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive.

In yet another aspect, there is provided a method of storing, transporting and delivering a formulation, comprising:

providing the formulation;
providing a container selected from the group consisting of a glass, plastic, metallic, and plastic or glass lined metallic container; and
introducing the formulation into the container wherein the formulation is selected from
(i) Formulation A comprising: (a) a silicon-containing precursor comprising an alkoxyalkylsilane having a formula of $Si(OR^1)_n R^2_{4-n}$; and (b) a catalyst comprising a haloalkoxyalkylsilane having a formula of $XSi(OR^1)_n R^2_{3-n}$; wherein $R^1$ is selected from the group consisting of a $C_1$-$C_{12}$ linear or branched alkyl group; a $C_3$-$C_{12}$ aryl group, a $C_3$-$C_{12}$ cycloalkyl group, a $C_2$-$C_{12}$ alkenyl group, and a $C_2$-$C_{12}$ alkynyl groups; $R^2$ is selected from the group consisting of $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting of F, Cl, Br and I; and
(ii) Formulation B comprising: (a) a silicon-containing precursor comprising a compound having a formula $R^2_{3-p}(R^1O)_p Si—R_3—Si(OR^1)_p R^2_{3-p}$ and (b) a catalyst comprising a haloalkoxysilane having a formula of $(R^1O)_m R^2_{2-m}(X)Si—R^3—Si(OR^4)_2 R^5$; where $R^1$ and $R^4$ are each independently selected from a $C_1$-$C_{12}$ linear or branched alkyl group; a $C_6$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{6-10}$ cyclic alkenediyl group; a $C_{6-10}$ bi-cyclic alkanediyl group; a $C_{6-10}$ cyclic alkenediyl group; a $C_{6-10}$ arenediyl group and; $R^5$ is selected from a linear or branched $C_1$-$C_{12}$ alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive.

In yet another aspect, there is provided a system for storing, transporting and delivering a formulation, comprising:
a container selected from the group consisting of a glass, plastic, metallic, and plastic or glass lined metallic container; and
the formulation disposed within the container wherein the formulation is selected from the group consisting of:
(1) Formulation A comprising:
(a) a silicon-containing precursor comprising an alkoxyalkylsilane having a formula of $Si(OR^1)_n R^2_{4-n}$; and (b) a catalyst comprising a haloalkoxyalkylsilane having a formula of $XSi(OR^1)_n R^2_{3-n}$; wherein $R^1$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group, and a $C_2$-$C_{12}$ alkynyl group; $R^2$ is selected from the group consisting of $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; and a hydrogen atom; wherein when $R^1$ is methyl, $R^2$ is not hydrogen; n is an integer ranging from 1 to 3 inclusive; and X is selected from the group consisting of F, Cl, Br and I; and
(2) a Formulation B comprising:
(a) a silicon-containing precursor comprising a compound having a formula $R^2_{3-p}(R^1O)_p Si—R^3—Si(OR^1)_p R^2_{3-p}$ and (b) a catalyst comprising a haloalkoxysilane having a formula of $(R^1O)_m R^2{}_{2-m}(X)Si-R^3-Si(OR^4)_2 R^5$; wherein $R^1$ and $R^4$ are each independently selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{5-10}$ cyclic alkenediyl; a $C_{6-10}$ bi-cyclic alkanediyl group; a $C_{6-10}$ cyclic alkenediyl group; a $C_{6-10}$ arenediyl group and; $R^5$ is selected from a linear or branched $C_1$-$C_{12}$ alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive.

In one particular embodiment, the haloalkoxysilane catalyst in the formulation reacts with water, ethanol, or mixture thereof to generate HX in the semiconductor process, and then HX accelerates the hydrolysis of alkoxy groups in both the silicon-containing precursor and the catalyst compound to form a silicon-containing film such as carbon doped silicon oxide containing $Si-R^3-Si$ linkage.

DETAILED DESCRIPTION OF THE INVENTION

Hydrohalic acids, such as HCl, can act as a catalyst to increase the rate of hydrolysis and condensation of alkoxysilane. However, a mixture of aqueous HCl with alkoxysilane would not be sufficiently stable to be useful as precursor in semiconductor process due to the hydrolysis reaction of alkoxysilanes with water. Furthermore, it is not practical to mix anhydrous hydrogen chloride directly with alkoxysilane since the former is a gas, making the mixture unstable and difficult to store and dispense reliably.

The present invention discloses a stable formulation comprising a silicon-containing precursor as deposition precursor, more specifically, an alkoxyalkylsilane, an alkoxysilane or and aryloxysilanes and a catalyst, more specifically, a haloalkoxyalkylsilane or a haloaryloxyalkysilane. The pre-mixtures, mixtures, and formulations described herein overcome the compositional change problem and other problems in the prior art by selecting an alkoxy group(s) or aryloxy group(s) in the catalyst that matches the alkoxy group(s) or the aryloxy group(s) in the silicon-containing precursor.

Formation of by-products decreases the purity level of the formulation and changes as small as 1-2% in chemical purity may be considered unacceptable for reliable semiconductor manufacture. The term "stable" as used herein means that the pre-mixture or formulation described herein does not change 0.5 weight (wt) % or greater, 1 wt % or greater, 2 wt % or greater, 5 wt % or greater, or 10 wt % or greater from its initial composition after being stored for a time period of six (6) months or greater, one (1) year or greater, two (2) years or greater or such other time period which is indicative of being shelf stable. For example, the concentration of the catalyst haloalkoxyalkylsilane or haloaryloxyalkylsilane component should not compositionally change by more than 10% of its initial percentage based on gas chromatography (GC) or other analytical techniques after storage for 1 year in order to be considered stable as described herein.

Substituents in alkoxysilanes and halosilanes, alkoxy groups and halogen atoms connected on silicon atom in silane derivatives are labile groups. These substituents scramble between molecules at room temperature via exchange reactions. The exchange reaction is a slow process which takes a relatively long time to reach equilibrium, especially at ambient temperature (e.g., 25° C.) or below and in the absence of acidic or basic impurities. One may observe a constant compositional change in mixtures or formulations containing alkoxysilane and halosilane. For example, in the mixture of methyltriethoxysilane and methyltrichlorosilane, the following compounds can be observed due to the exchange of ethoxy group and chloride (as shown by Reaction Scheme 1 below):

Reaction Scheme 1

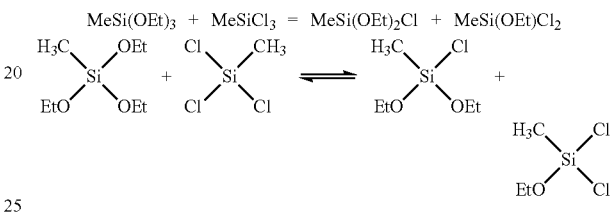

Precursor formulations containing different alkoxysilanes undergo substituent exchange reaction, especially when trace amount of acid or base exists as a catalyst. In a formulation containing triethoxysilane and trimethoxysilane, one may observe the generation of new species, $HSi(OEt)_2OMe$ and $HSi(OEt)(OMe)_2$, at a relatively slow rate. The above mixtures would undergo constant compositional change during manufacture, transportation, and storage. Therefore, these formulations are chemically unstable as shown by Reaction Scheme 2 below:

Reaction Scheme 2

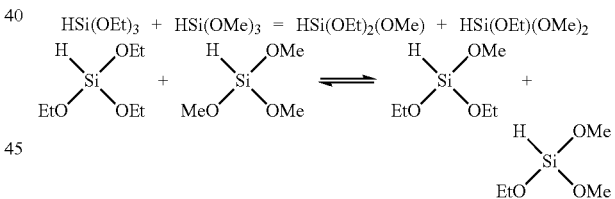

In another formulation containing methyltriethoxysilane and chlorotriethoxysilane, one may also observe generation of two new compounds, namely methylchlorodiethoxysilane and tetraethoxysilane, suggesting that the formulation is not stable as demonstrated by Reaction Scheme 3 below:

Reaction Scheme 3

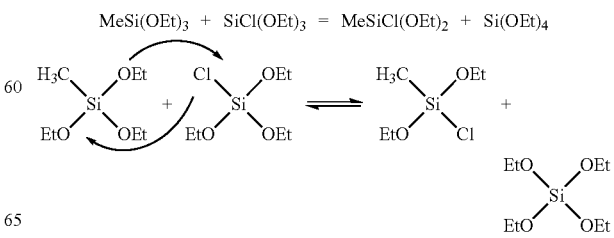

Further, the application of organosilicon precursor in semiconductor process requires strict compositional control for consistent process performance. Unstable precursor or precursor formulations are not suitable in practical use.

The pre-mixtures, mixtures, and formulations described in this invention overcome the problems of the prior art shown by Reaction Schemes 1, 2, and 3 above by selecting the alkoxy group(s) or aryl group(s) in the catalyst to match the alkoxy group(s) or aryl group(s) in the silicon-containing precursor in the formulation. For example, an alkoxyalkylsilane and a haloalkoxyalkylsilane catalyst may undergo chloride-alkoxy exchange reaction but not generate new compounds as exchange products. The matched alkoxy or aryl group in the both the haloalkoxysilane catalyst and the alkoxyalkylsilane makes the products of the chloride-alkoxy exchange reaction identical to the starting molecules as shown by Reaction Scheme 4 below:

Reaction Scheme 4

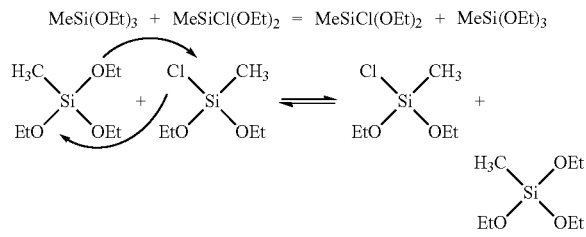

As a result of matching the alkoxy group(s) or aryl group(s) in both the silicon-containing precursor and the catalyst, the composition of the formulation, mixture, or pre-mixture does not change with time regardless of the storage time and storage temperature. Thus, the formulation is stable and suitable for application in semiconductor process.

As previously mentioned, described herein is a pre-mixture, mixture or formulation comprising a silicon-containing precursor, more specifically, an alkoxyalkylsilane, such as an alkoxysilane or aryloxysilane, and a catalyst, more specifically, a haloalkoxyalkylsilane. The haloalkoxysilane within the formulation generates HCl upon contact with water, alcohol, or combination thereof in the process. The HCl accelerates the hydrolysis reaction of the silicon-containing precursor and the condensation reaction to form crosslinked silicon oxide films. In these or other embodiments, the alkoxysilane or the silicon-containing precursor can mean an alkoxyalkylsilane and the haloalkoxysilane can mean a haloalkoxyalkylsilane. In further embodiments, the alkoxysilane or the silicon-containing precursor can mean an aryloxyalkylsilane and the haloalkoxysilane can mean a haloalkoxyarylsilane.

In one particular embodiment, the addition of the catalyst compound $XSi(OR^1)_nR^2_{3-n}$, such as $ClSi(OR^1)_nR^2_{3-n}$, to the silicon-containing compound alkoxyalkylsilane $Si(OR^1)_nR^2_{4-n}$ accelerates the hydrolysis and condensation reactions of $Si(OR^1)_nR^2_{4-n}$ when exposed to water and/or alcohols but yet remains as a stable mixture or a stable formulation prior to exposure to water and/or alcohol. In this embodiment, the alkoxyalkylsilane $Si(OR^1)_nR^2_{4-n}$ and the chloroalkoxyalkylsilane $ClSi(OR^1)_nR^2_{3-n}$ in the formulation are mutually compatible wherein the silicon containing precursor and catalyst are freely miscible and do not react with each other to form other compounds or interfere in any way with their stability.

In one embodiment, there is provided a formulation or Formulation A comprising: a silicon-containing precursor comprising an alkoxyalkylsilane having a formula of $Si(OR^1)_nR^2_{4-n}$; and a catalyst comprising a haloalkoxyalkylsilane or haloaryloxyalkylsilane having a formula of $XSi(OR^1)_nR^2_{3-n}$; wherein $R^1$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting of from F, Cl, Br and I. $R^1$ and $R^2$ may be the same or different in the silicon-containing precursor. $R^1$ and $R^2$ may be the same or different in the catalyst precursor. However, when $R^1$ is a methyl group, $R^2$ cannot be hydrogen, since $ClSiH(OMe)_2$ is not a stable compound (see Supporting Information of "Nonhydrolytic Synthesis of Branched Alkyoxysilane Oligomers $Si[OSiH(OR_2]_4$ (R=Me, Et)", Wakabayashi et al., Angewandte Chem., 2010, 49, pp. 5273-77 (e.g., "The silylating agent cannot be stored for a long time after the synthesis because $ClSiH(OMe)_2$ degrades, even if it is stored in a refrigerator")).

Formulation A comprises 50 weight % (wt %) $Si(OR^1)_nR^2_{4-n}$, or greater, 60 wt % or greater, 70 wt % or greater, 80 wt % or greater, or 90 wt % or greater of the silicon-containing precursor having the formula $Si(OR^1)_nR^2_{4-n}$. Formulation A further comprises 10 wt % or less; 7.5 wt % or less, 5 wt % or less, 2.5 wt % or less, 50 parts per million (ppm) or less, 25 ppm or less of the catalyst compound having the formula $XSi(OR^1)_nR^2_{3-n}$. In the foregoing, the amount of silicon-containing precursor catalyst compound within the formulations can range from any one or more of the following end-points. Examples of suitable ranges of the amount of catalyst compound with the formula $XSi(OR^1)_nR^2_{3-n}$ can include without limitation, 25 ppm to 10 wt % and 50 ppm to 5 wt %. Formulation A may further comprise one or more solvents, surfactants, porogens, and combinations thereof.

In one particular embodiment, $R^1$ and $R^2$ in the catalyst haloalkoxyalkylsilane and in silicon-containing precursor alkoxyalkylsilane are the same. The catalyst compound or haloalkoxyalkylsilane $XSi(OR^1)_nR^2_{3-n}$ reacts with water to generate HX in the semiconductor process, and then HX accelerates the hydrolysis of alkoxy groups in both alkoxyalkylsilane and haloalkoxyalkylsilane to form the Si—O—Si network.

Examples of pre-mixtures and formulations described herein include but not limited to: methyltriethoxysilane and methylchlorodiethoxysilane; ethyltriethoxysilane and ethylbromodiethoxysilane; triethoxysilane and chlorodiethoxysilane; phenyltrimethoxysilane and phenylchlorodimethoxysilane; methyltriphenoxysilane and methylchlorodiphenoxysilane; and methyltrimethoxysilane and methylchlorodimethoxysilane.

In a further embodiment, there is provided a formulation or Formulation B comprising a silicon-containing precursor comprising a compound having a formula $R^2_{3-p}(R^1O)_pSi$—$R^3$—$Si(OR^1)_pR^2_{3-p}$ and a catalyst compound comprising a haloalkoxyalkylsilane having a formula of $(R^1O)_mR^2_{2-m}(X)Si$—$R^3$—$Si(OR^4)_2R^5$; where $R^1$ and $R^4$ are each independently selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{5-10}$ cyclic alkenediyl group; a $C_{6-10}$ bi-cyclic alkanediyl group; a $C_{6-10}$ cyclic alkenediyl group; a $C_{6-10}$ arenediyl group and; $R^5$ is selected from a linear or branched $C_1$-$C_{12}$ alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive. In one particular embodiment of Formulation B, $R^1$ and $R^4$ in catalyst compound haloalkoxysilane and in precursor alkoxysilane are the same. Formulation B comprises 50 weight % (wt %) $Si(OR^1)_nR^2_{4-n}$, or greater, 60 wt % or greater, 70 wt % or greater, 80 wt % or greater, or 90 wt % or greater of the silicon-containing precursor having the formula having a formula of $R^2_{3-p}(R^1O)_pSi\text{---}R^3\text{---}Si(OR^1)_pR^2_{3-p}$. Formulation B further comprises 10 wt % or less; 7.5 wt % or less, 5 wt % or less, 2.5 wt % or less, 50 parts per million (ppm) or less, 25 ppm or less of the catalyst compound having the formula $(R^1O)_mR^2_{2-m}(X)Si\text{---}R^3\text{---}Si(OR^4)_2R^5$. In the foregoing, the amount of silicon-containing precursor catalyst compound within the formulations can range from any one or more of the following end-points. Examples of suitable ranges of the amount of catalyst compound the formula $(R^1O)_mR^2_{2-m}(X)Si\text{---}R^3\text{---}Si(OR^4)_2R^5$ can include without limitation, 25 ppm to 10 wt % and 50 ppm to 5 wt %. Formulation B may further comprise one or more solvents surfactants, porogens, and combinations thereof.

In Formulation B, the catalyst compound or haloalkoxyalkylsilane $(R^1O)_mR^2_{2-m}(X)Si\text{---}R^3\text{---}Si(OR^4)_3$ can react with water to generate HX in the process, and then HX accelerates the hydrolysis of alkoxy groups in both alkoxysilane and haloalkoxysilane in a vapor deposition process to form carbon doped silicon oxide containing Si—$R^3$—Si linkage. The addition of $(R^1O)_mR^2_{2-m}(X)Si\text{---}R^3\text{---}Si(OR^4)_2R^5$ component, such as $(R^1O)_mR^2_{2-m}ClSi\text{---}R^3\text{---}Si(OR^4)_3$ to the silicon-containing precursor $R^2_{3-p}(R^1O)_pSi\text{---}R^3\text{---}Si(OR^1)_pR^2_{3-p}$ is to accelerate the hydrolysis and condensation reactions of $R^2_{3-p}(R^1O)_pSi\text{---}R^3\text{---}Si(OR^1)_pR^2_{3-p}$ when exposed to water and/or alcohols but yet remain as a stable formulation prior to exposure to moisture. $R^3$ can be incorporated into the resulting films, thus enhancing some of the physical properties of the films such as mechanical property, low k, etc.

Examples of $(R^1O)_mR^2_{2-m}(X)Si\text{---}R^3\text{---}Si(OR^4)_2R^5$ or catalyst compounds of Formulation B include but are not limited to: (trimethoxysilyl)(dimethoxychlorosilyl)methane (MeO)$_2$ClSi—CH$_2$—Si(OMe)$_3$, (triethoxysilyl)(diethoxychlorosilyl)methane (EtO)$_2$ClSi—CH$_2$—Si(OEt)$_3$, 1-(trimethoxysilyl)-2-(dimethoxychlorosilyl)ethane (MeO)$_2$ClSi—CH$_2$CH$_2$—Si(OMe)$_3$, 1-(triethoxysilyl)-2-(diethoxychlorosilyl)ethane (EtO)$_2$ClSi—CH$_2$CH$_2$—Si(OEt)$_3$, (chloromethoxymethylsilyl) (dimethoxymethylsilyl)methane (MeO)ClMeSi—CH$_2$SiMe(OMe)$_2$, (chloroethoxymethylsilyl)(diethoxymethylsilyl)methane (EtO)ClMeSi—CH$_2$—SiMe(OEt)$_2$, 1-(chloromethoxymethylsilyl)-2-(dimethoxymethylsilyl)ethane (MeO)ClMeSi—CH$_2$CH$_2$—SiMe(OMe)$_2$, 1-(chloroethoxymethylsilyl)-2-(diethoxymethylsilyl)ethane (EtO)ClMeSi—CH$_2$CH$_2$—SiMe(OEt)$_2$.

Examples of silicon-containing precursors in Formulation B having formula $R^2_{3-p}(R^1O)_pSi\text{---}R^3\text{---}Si(OR^1)_pR^2_{3-p}$ include but not limited to: bis(trimethoxysilyl)methane (MeO)$_3$Si—CH$_2$—Si(OMe)$_3$, bis(triethoxysilyl)methane (EtO)$_3$Si—CH$_2$—Si(OEt)$_3$, bis(trimethoxysilyl)ethane (MeO)$_3$Si—CH$_2$CH$_2$—Si(OMe)$_3$, bis(triethoxysilyl)ethane (EtO)$_3$Si—CH$_2$CH$_2$—Si(OEt)$_3$, bis(dimethoxymethylsilyl) methane (MeO)$_2$MeSi—CH$_2$—SiMe(OMe)$_2$, bis(diethoxymethylsilyl)methane (EtO)$_2$MeSi—CH$_2$—SiMe(OEt)$_2$, bis(dimethoxymethylsilyl)ethane (MeO)$_2$MeSi—CH$_2$CH$_2$—SiMe(OMe)$_2$, bis(diethoxymethylsilyl)ethane (EtO)$_2$MeSi—CH$_2$CH$_2$—SiMe(OEt)$_2$.

In the formulas above and throughout the description, the term "alkyl" denotes a linear or branched functional group having from 1 to 12, 1 to 10, 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, isopropyl, isobutyl, sec-butyl, tert-butyl, iso-pentyl, tert-pentyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulas above and throughout the description, the term "cyclic alkyl" denotes a cyclic group having from 3 to 12 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group In the formulas above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulas above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

The term "alkynyl group" denotes a group which has one or more carbon-carbon triple bonds and has from 2 to 12 or from 2 to 6 carbon atoms.

In the formulas above and throughout the description, the term "alkoxy" denotes an alkyl group which has is linked to an oxygen atom (e.g., R—O) and may have from 1 to 12 or from 1 to 6 carbon atoms. Exemplary alkoxy groups include, but are not limited to, methoxy (—OCH$_3$), ethoxy(—OCH$_2$CH$_3$), n-propoxy (—OCH$_2$CH$_2$CH$_3$), and iso-propoxy (—OCHMe$_2$).

In the formulas above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In the formulas above and throughout the description, the term "alkylamino group" denotes a group which has one or two alkyl groups attached to a nitrogen atom and has from 1 to 20 or from 2 to 12 or from 2 to 6 carbon atoms. An example of an alkylamino group can be, without limitation, a piperidine group.

In certain embodiments, one or more of the alkyl group, alkenyl group, alkynyl group, alkoxyalkyl group, alkoxy group, alkylaminoalkyl group, aryl group, and/or aromatic group in the formulas may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. In other embodiments, one or more of the alkyl group, alkenyl group, alkynyl group, alkoxyalkyl group, alkoxy group, alkylaminoalkyl group, aromatic and/or aryl group in the formulas may be unsubstituted.

Examples of substituent $R^1$ in the formulas described herein include, but are not limited to, methyl ($CH_3$), ethyl ($C_2H_5$), n-propyl ($C_3H_7$), isopropyl [$(CH_3)_2CH$], n-butyl, 2-ethylhexyl, isobutyl, sec-butyl, n-pentyl, isopentyl, neo-pentyl and tert-pentyl, allyl (2-propenyl), homoallyl (3-butenyl), propargyl (2-propynyl), 2-hydroxyethyl, 2-hydroxypropyl, 2-methoxyethyl, phenyl, tolyl, xylyl, hydroxyphenyl, lauryl, napthyl, indenyl, and benzyl. Preferred $R^1$ includes: methyl, ethyl, isopropyl, tert-butyl and phenyl.

Preferred embodiments for $R^2$ include: methyl, ethyl, isopropyl, vinyl, tert-butyl, phenyl and hydrogen. The most preferred for $R^1$ includes: methyl and ethyl. Examples of substituents $R^2$ in the formulas described herein include, but are not limited to, methyl ($CH_3$), ethyl ($C_2H_5$), n-propyl ($C_3H_7$), isopropyl [$(CH_3)_2CH$], n-butyl, 2-ethylhexyl, isobutyl, sec-butyl, n-pentyl, isopentyl, neopentyl and tert-pentyl, vinyl (ethenyl), allyl (2-propenyl), homoallyl (3-butenyl), propargyl (2-propynyl), 2-hydroxyethyl, 2-hydroxypropyl, 2-methoxyethyl, phenyl, tolyl, xylyl, hydroxyphenyl, lauryl, napthyl, indenyl, benzyl, hydrogen and mixtures thereof. The most preferred $R^2$ includes: methyl, ethyl, vinyl and hydrogen.

Examples for X in the formulas described herein include, but are not limited to, F, Cl, Br, and I. The preferred X is Cl.

Examples of $R^3$ which is a di-radical and connected to two silicon atoms include but not limited to:

methylene (.$CH_2$.), ethanediyl (.$CH_2CH_2$.), ethenediyl (.CH=CH.),

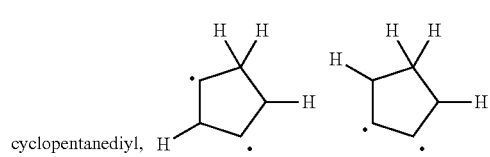

cyclopentanediyl, cyclohexanediyl

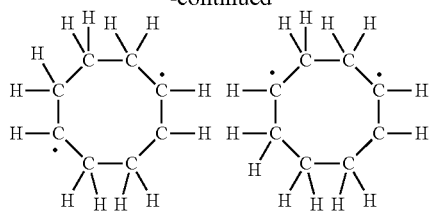

cyclooctanediyl bi-cycloheptanediyl

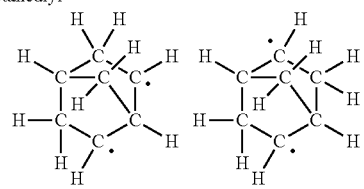

Benzenediyl (.$C_6H_4$.).

The formulations may be stored, transported and delivered in glass, plastic, or metallic containers or other suitable containers known in the art, such as the containers disclosed in the following U.S. Pat. Nos. 4,828,131; 6,077,356; 6,526,824; 7,124,913; and 7,261,118, all of which are herein incorporated by reference in their entirety.

Plastic or glass lined metallic containers may also be used. Preferably, the material is stored and delivered from a hermetically sealed high purity stainless steel or nickel alloy vessel. Most preferably, the material is stored and delivered from a hermetically sealed high purity stainless steel or nickel alloy vessel equipped with a down tube and an outlet in communication with the vapor space of the vessel; allowing the product to be delivered either as a liquid from the downtube or as a vapor from the outlet connection in communication with the vapor phase. In the latter case, the downtube may be optionally used to introduce a carrier gas into the vessel to promote the vaporization of the mixture. In this embodiment, the downtube and vapor outlet connections are equipped with high integrity packless valves. While delivery of the liquid is preferred to avoid partitioning of the components of this formulation in the present invention, it should be noted that the formulations of the present invention match the vapor pressure of the components closely enough to enable the formulation to be delivered as a vapor mixture. Stainless steel may preferably be chosen from UNS alloy numbers S31600, S31603, S30400, S30403, S31700, S31703, S31500, S31803, S32750, and S31254. Nickel alloys may preferably be chosen from UNS alloy numbers N06625, N10665, N06022, N10276, and N06007. Most preferably, the vessels are made from alloys S31603 or N06022, either uncoated, internally electropolished or internally coated with a fluoropolymer.

The formulations as the main deposition precursor may be used in a process to deposit a dielectric film by using techniques known in the art. The formulations can be pre-mixed mixtures, or premixtures (mixed before being used in the deposition process), or in-situ mixtures (mixed during the deposition process). Thus, in this disclosure the terms "mixture" and "formulation" are interchangeable.

The formulation of the present invention may be combined with a second formulation containing water and optional co-solvents, surfactants and other additives and deposited onto a substrate. Distribution or delivery of this reaction formulation may be achieved by direct liquid injection, spraying, dipping, co-condensation or centrifugal spin-coating. The formulation is then allowed to react until a solid film or body is obtained. The use of inert gas, vacuum, heat or external energy source (light, heat, plasma, e-beam, etc.) to remove unreacted volatile species, including solvents and unreacted water may follow to facilitate the condensation of the film. The formulations of the present invention may preferably be delivered to a substrate contained in a deposition chamber a process fluid such as without limitation, a gas phase, liquid droplets, mist, fog, aerosol, sublimed solid, or combination thereof with water and optionally co-solvents and other additives also added as a process fluid such as a gas, vapor, aerosol, mist, or combination thereof. Preferably, the formulation of the present invention condenses or dissolves into a condensed film on the surface of the substrate, which may advantageously be held at a temperature below that of the walls of the chamber. The co-mixed deposition precursor and catalyst of the present invention can react at a uniform rate on the surface of the substrate rendering the reaction products into a non-volatile film. Unreacted precursors, water and optional co-solvents and additives may then be removed by gas purge, vacuum, heating, addition of external radiation (light, plasma, electron beam, etc.) until a stable solid silicon-containing film is obtained.

One advantage of the formulations described herein is that the catalyst compounds and the silicon-containing precursor are mutually compatible (e.g., are freely miscible and do not react with each other to generate other impurities). This advantage allows these formulations to be stored for an extended period without any compositional changes which can adversely affect the performance of the formulation. Preferably, these formulations have a usable shelf-life of 1 year or greater or 2 years or greater. The use of a premixture, as distinct from co-delivering the catalyst and silicon-containing or deposition precursors separately (thus forming an in-situ mixture), is that the premixtures promotes uniform deposition, since adding the catalyst as a separate stream can lead to non-uniform catalyst distribution, may be variable over time, and/or adds complexity and cost to the deposition process.

The following examples illustrate the mixtures, premixtures, formulations and components thereof described herein and are not intended to limit it in any way.

EXAMPLES

Example 1: Formulation of Chlorodiethoxymethylsilane and Methyltriethoxysilane as a Sol-Gel Precursor with Enhanced Hydrolysis Rate To a closed container filled with 5857 g of methyltriethoxysilane (MTES) was added 143 g of chlorodiethoxymethylsilane (Cl-DEMS). The resulting mixture was sparged with helium (He) gas to combine the liquids. In order to measure the reaction rate of water with the silicon containing precursors, a mixture 88.2 g ethanol, 8.69 g water and 0.55 g dodecane was made. The small quantity of dodecane was added to the ethanol/water mixture to serve as an internal standard. A 4 milliliter (mL) glass vial containing 0.15 mL of the silicon containing mixture was treated with 1.5 g of the ethanol/water/dodecane mixture. The combined solutions were shaken for 1 minute and an aliquot was then analyzed by gas chromatography with a thermal conductivity detector. After 15 minutes, a second aliquot was analyzed by gas chromatography and the results were compared.

Example 1a: Methyltriethoxysilane (MTES) with No Chlorodiethoxymethylsilane (Cl-DEMS) Present (Comparative)

The mixture of 0.15 mL of MTES with the ethanol/water mixture described above in Example 1 but without chlorodiethoxymethylsilane was analyzed in duplicate. The ratio of the MTES:dodecane peak areas was 28.2±0.3 after 1 minute and 28.0±0.3 after 15 minutes. This corresponds to a negligible reaction rate.

Example 1b: Formulation of MTES with 2.4% Cl-DEMS

The mixture of 0.15 mL of a 2.4% Cl-DEMS in MTES with the ethanol/water mixture described above in Example 1 was analyzed in duplicate. The ratio of the MTES:dodecane peak areas was 0.71±0.02 after 1 minute and 0.107±0.002 after 15 minutes. The relative conversion of MTES was approximately 97% after 1 minute and 99.6% after 15 minutes.

Comparing the results of Example 1a and 1b shows that addition of the catalyst to the formulation significantly increased the reaction rate of both the halogen-containing catalyst component as well as the bulk silicon-containing component. This example demonstrated that chlorodiethoxymethylsilane is an effective hydrolysis and/or alcoholysis catalyst for methyltriethoxysilane even though the mixture is stable in the absence of water and/or alcohol.

Comparative Example 2: Formulation of Methyltriethoxysilane with Chlorotriethoxysilane The mixture of 0.15 mL of MTES with the ethanol/water mixture described above was analyzed in duplicate. The ratio of the MTES:dodecane peak areas was 28.2±0.3 after 1 minute and 28.0±0.3 after 15 minutes. This corresponds to a negligible reaction rate.

A 0.56 weight percent mixture of chlorotriethoxysilane (Cl-TES) in methyltriethoxysilane. The mixture was analyzed by gas chromatography with a thermal conductivity detector. Within one day, the bulk of the total chromatographic area was attributable to MTES with 0.40% of the total area associated with Cl-TES and 0.08% of the area associated with tetraethoxysilane (TEOS) and 0.003% of the area associated with Cl-DEMS. After storing this mixture for 34 days, the peak associated with Cl-TES decreased to 0.002% while TEOS increased to 0.54% and Cl-DEMS increased to 0.39%. After an additional three days, the Cl-TES was no longer detectable on the gas chromatogram and the TEOS area further increased to 0.58% and the Cl-DEMS increased to 0.40%. The presence of TEOS in the mixture, especially at varying levels is considered undesirable, while the changing nature of the chlorinated compound is unacceptable as it makes the performance of the mixture, including its reactivity, vary over time.

Example 3: Formulation of Methyltriethoxysilane with Chlorodiethoxymethylsilane

A 2.4 weight percent mixture of chlorodiethoxymethylsilane (Cl-DEMS) in methltriethoxysilane was prepared. The area of the gas chromatographic peak corresponding to Cl-DEMS was 2.2% of the total chromatographic area. After 47 days, the mixture was re-analyzed and found to be essentially unchanged, with the corresponding peak area still at 2.2% of the total and no significant new peaks were observed.

The working examples have shown that a mixture of methyltriethoxysilane (MTES) [$R^1$=ethyl, $R^2$=methyl], with chlorotriethoxysilane (Cl-TES) ($R^1$=$R^2$=ethyl) slowly over the course of several weeks at ambient temperature reacted to make a mixture of the starting compounds along with measurable amounts tetraethoxysilane (TEOS) and methyldiethoxychlorosilane (Cl-DEMS). This gradual change in the mixture as well as the appearance of an exogenous material (in this case TEOS) in varying concentrations over time is undesired, because film growth performance and composition varies depending on the age of the mixture. In contrast, a mixture of methyltriethoxysilane (MTES) [$R^1$=ethyl, $R^2$=methyl], with chlorodiethoxymethylsilane (Cl-DEMS)[$R^1$=ethyl, $R^2$=methyl], did not scramble and the mixtures remain stable over time.

Stability of the mixtures of chlorinated catalysts in methyltriethoxysilane was shown in Table I below.

TABLE I

Stability of chlorinated catalysts in methyltriethoxysilane

| Example number | Catalyst Compound | Days at ambient temperature | % Loss of catalyst |
| --- | --- | --- | --- |
| 2 (comparative) | chlorotriethoxysilane | 1 | 29 |
| 2 (comparative) | chlorotriethoxysilane | 34 | >99 |
| 3 | chlorodiethoxymethylsilane | 47 | 0 |

Example 4: Formulation of Bis(Tert-Butoxy)Silane with Bis(Tert-Butoxy)Chlorosilane A mixture of bis(tert-butoxy)silane ($R^1$=tert-$C_4H_9$; $R^2$=H, n=2) containing 1% by weight of bis(tert-butoxy)chlorosilane is prepared. The mixture remains stable since any scrambling of the alkoxy substituents and the chloride substituent that might occur do not produce any new components.

Example 5: Formulation of Methyltrimethoxysilane with Methyldimethoxybromosilane A mixture of methyltrimethoxysilane ($R^1$=$CH_3$; $R^2$=$CH_3$, n=3) containing 1% by weight of methyldimethoxybromosilane (X=Br) is prepared. The mixture remains stable since any scrambling of the alkoxy substituents and the bromide substituent that might occur do not produce any new components.

Example 6: Formulation of n-Hexyltrimethoxysilane with Hexyldimethoxychlorosilane A mixture of n-hexyltrimethoxysilane ($R^1$=$CH_3$; $R^2$=n-$C_6H_{13}$, n=3) containing 2.5% by weight of hexyldimethoxychlorosilane is prepared. The mixture remains stable since any scrambling of the alkoxy substituents and the chloride substituent that might occur do not produce any new components.

Example 7: Formulation of Tetramethoxysilane with Trimethoxychlorosilane

A mixture of tetramethoxysilane ($R^1$=$CH_3$, n=4) containing 1% by weight of chlorotrimethoxysilane is prepared. The mixture remains stable since any scrambling of the alkoxy substituents and the chloride substituent that might occur do not produce any new components.

Example 8: Formulation of Methyltrimethoxysilane with Methyldimethoxychlorosilane A mixture of methyltrimethoxysilane ($R^1$=$CH_3$; $R^2$=$CH_3$, n=3) containing 2% by weight of methyldimethoxychlorosilane (X=Cl) is prepared. The mixture remains stable since any scrambling of the alkoxy substituents and the chloride substituent that might occur do not produce any new components. The mixture is rapidly hydrolyzed when mixed with an aqueous mixture to form a dielectric film after drying.

Example 9: Formulation of 1,2-bis(trimethoxysilyl)ethane with 1-(trimethoxysilyl)-2-(dimethoxychlorosilyl)ethane A mixture of 1,2-bis(trimethoxysilyl)ethane, $(CH_3O)_3Si—CH_2—CH_2—Si(OCH_3)_3$, ($R^1$=$CH_3$, $R^3$=—$CH_2CH_2$—, p=3 in the formula $R^2_{3-p}(R^1O)_pSi—R^3—Si(OR^1)_pR^2_{3-p}$) containing 5% by weight of 1-(trimethoxysilyl)-2-(dimethoxychlorosilyl) ($R^1$=$CH_3$, $R^3$=—$CH_2CH_2$—, $R^4$=$CH_3$, $R^5$=$OCH_3$, X=Cl, m=2 in the formula $(R^1O)_mR^2_{2-m}(X)Si—R^3—Si(OR^4)_2R^5$) is prepared. The mixture remains stable since any scrambling of the alkoxy substituents and the chloride substituent that might occur do not produce significant quantities of any new components. The mixture is rapidly hydrolyzed when mixed with an aqueous mixture to form a silicon oxide film.

In summary, the formulation comprising a silicon-containing precursor and a catalyst compound having at least the same $R^1$ present in both compounds remained stable when stored under ambient temperature conditions. In contrast, other formulations where $R^1$ in the silicon-containing precursor and catalyst are not the same exhibit scrambling between the substituents within the silicon containing precursor and the catalyst and produce a non-productive reaction which indicates a marked instability of the formulation.

The invention claimed is:
1. A formulation comprising
  (a) a silicon-containing precursor comprising a compound having a formula $R^2_{3-p}(R^1O)_pSi—R^3—Si(OR^1)_pR^2_{3-p}$ and
  (b) a catalyst comprising a haloalkoxyalkylsilane having a formula of $(R^1O)_mR^2_{2-m}(X)Si—R^3—Si(OR^4)_2R^5$; wherein $R^1$ and $R^4$ are each independently selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{5-10}$ cyclic alkenediyl group; a $C_{6-10}$ bi-cyclic alkanediyl group; a $C_{6-10}$ cyclic alkenediyl group; a $C_{6-10}$ arenediyl group; and $R^5$ is selected from a linear or branched $C_1$-$C_{12}$ alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive; and wherein

$R^1$ in the silicon containing precursor and $R^1$ in the catalyst are the same substituents and the concentration of the silicon-containing precursor and the catalyst does not change by more than 10 wt %, based upon gas chromatography, after storage for a period of one year.

2. The Formulation of claim 1 wherein $R^1$ and $R^4$ are selected from the group consisting of methyl, ethyl, n-propyl, isopropyl, n-butyl, tert-butyl, 2-ethylhexyl, isobutyl, sec-butyl, n-pentyl, isopentyl, neopentyl and tert-pentyl, allyl (2-propenyl), homoallyl (3-butenyl), propargyl (2-propynyl), 2-hydroxyethyl, 2-hydroxypropyl, 2-methoxyethyl, phenyl, tolyl, xylyl, hydroxyphenyl, lauryl, napthyl, indenyl, benzyl, and mixtures thereof, and $R^2$ is selected from the group consisting of methyl, ethyl, n-propyl, isopropyl, n-butyl, tert-butyl, 2-ethylhexyl, isobutyl, sec-butyl, n-pentyl, isopentyl, neopentyl and tert-pentyl, vinyl (ethenyl), allyl (2-propenyl), homoallyl (3-butenyl), propargyl (2-propynyl), 2-hydroxyethyl, 2-hydroxypropyl, 2-methoxyethyl, phenyl, tolyl, xylyl, hydroxyphenyl, lauryl, napthyl, indenyl, benzyl, hydrogen and mixtures thereof.

3. The formulation of claim 1 wherein $R^1$ and $R^4$ are selected from the group consisting of methyl, ethyl, isopropyl, tert-butyl, phenyl, and mixtures thereof; $R^2$ is selected from the group consisting of methyl, ethyl, isopropyl, vinyl, tert-butyl, phenyl, hydrogen, and mixtures thereof; $R^3$ is selected from the group consisting of methylene (—$CH_2$—), ethanediyl (—$CH_2CH_2$—), ethylenediyl (—CH=CH—), cyclopentenediyl, cyclohexenediyl, cyclooctenediyl, tricycloheptanediyl.

4. The formulation of claim 1 wherein $R^1$ and $R^4$ are selected from the group consisting of methyl and ethyl; $R^2$ is selected from the group consisting of methyl, ethyl, vinyl, tert-butyl, hydrogen, and mixtures thereof; $R^3$ is selected from the group consisting of methylene, ethanediyl, ethenediyl, cyclopentenediyl, cyclohexenediyl, cyclooctenediyl, bi-cycloheptanediyl, benzenediyl; $R^5$ is selected from methyl, ethyl, methoxy, ethoxy, and X is Cl.

5. The formulation of claim 1 wherein $(R^1O)_mR^2_{2-m}(X)Si$—$R^3$—$Si(OR^4)_2R^5$ is selected from the group consisting of bis(trimethoxysilyl)(dimethoxychlorosilyl)methane $(MeO)_2ClSi$—$CH_2$—$Si(OMe)_3$, (triethoxysilyl)(diethoxychlorosilyl)methane $(EtO)_2ClSi$—$CH_2$—$Si(OEt)_3$, 1-(trimethoxysilyl)-2-(dimethoxychlorosilyl)ethane $(MeO)_2ClSi$—$CH_2CH_2$—$Si(OMe)_3$, 1-(triethoxysilyl)-2-(diethoxychlorosilyl)ethane $(EtO)_2ClSi$—$CH_2CH_2$—$Si(OEt)_3$, (chloromethoxymethylsilyl)(dimethoxymethylsilyl)methane $(MeO)ClMeSi$-$CH_2SiMe(OMe)_2$, (chloroethoxymethylsilyl)(diethoxymethylsilyl)methane $(EtO)ClMeSi$—$CH_2$—$SiMe(OEt)_2$, 1-(chloromethoxymethylsilyl)-2-(dimethoxymethylsilyl)ethane $(MeO)ClMeSi$—$CH_2CH_2$—$SiMe(OMe)_2$, 1-(chloroethoxymethylsilyl)-2-(diethoxymethylsilyl)ethane $(EtO)ClMeSi$—$CH_2CH_2$—$SiMe(OEt)_2$, and combinations thereof.

6. The formulation of claim 1 wherein $R^2_{3-p}(R^1O)_pSi$—$R^3$—$Si(OR^1)_pR^2_{3-p}$ is selected from the group consisting of bis(trimethoxysilyl)methane $(MeO)_3Si$—$CH_2$—$Si(OMe)_3$, bis(triethoxysilyl)methane $(EtO)_3Si$—$CH_2$—$Si(OEt)_3$, bis(trimethoxysilyl)ethane $(MeO)_3Si$—$CH_2CH_2$—$Si(OMe)_3$, bis(triethoxysilyl)ethane $(EtO)_3Si$—$CH_2CH_2$—$Si(OEt)_3$, bis(dimethoxymethylsilyl)methane $(MeO)_2MeSi$—$CH_2$—$SiMe(OMe)_2$, bis(diethoxymethylsilyl)methane $(EtO)_2MeSi$—$CH_2$—$SiMe(OEt)_2$, bis(dimethoxymethylsilyl)ethane $(MeO)_2MeSi$—$CH_2CH_2$—$SiMe(OMe)_2$, bis(diethoxymethylsilyl)ethane $(EtO)_2MeSi$—$CH_2CH_2$—$SiMe(OEt)_2$, and combinations thereof.

7. The formulation of claim 1 wherein the formulation is selected from the group consisting of bis(trimethoxysilyl)methane and (trimethoxysilyl)(dimethoxychlorosilyl)methane; bis(triethoxysilyl)methane and (triethoxysilyl)(diethoxychlorosilyl)methane; 1,2-bis(trimethoxysilyl)ethane and 1-(trimethoxysilyl)-2-(dimethoxychlorosilyl)ethane; 1,2-bis(triethoxysilyl)ethane and 1-(triethoxysilyl)-2-(diethoxychlorosilyl)ethane; bis(dimethoxymethylsilyl)methane and (trimethoxysilyl(dimethoxychlorosilyl)methane; bis(diethoxymethylsilyl)methane and (triethoxysilyl)(diethoxychlorosilyl)methane; 1,2-bis(dimethoxymethylsilyl)methane and 1-(trimethoxysilyl)-2-(dimethoxychlorosilyl)methane; 1,2-bis(diethoxymethylsilyl)ethane and 1-(triethoxysilyl)-2-(diethoxychlorosilyl)ethane.

8. The formulation of claim 1 wherein the amount of the silicon-containing precursor present in the formulation is 50 wt % or greater.

9. The formulation of claim 8, wherein the amount of the silicon-containing precursor present in the formulation is 80 wt % or greater.

10. The formulation of claim 1, wherein the amount of the catalyst compound in the formulation is 10 parts per million (ppm) by weight or greater.

11. The formulation of claim 10, wherein the amount of the catalyst compound in the formulation ranges from 25 ppm to 10 wt %.

12. The formulation of claim 11, wherein the amount of the catalyst compound in the formulation ranges from 50 ppm to 5 wt %.

13. A stable formulation comprising:
(a) a silicon-containing precursor comprising an alkoxyalkylsilane having a formula of $Si(OR^1)_nR^2_{4-n}$; and
(b) a catalyst comprising a haloalkoxyalkylsilane having a formula of $XSi(OR^1)_nR^2_{3-n}$; wherein $R^1$ is selected from the group consisting of a $C_1$-$C_{12}$ linear or branched alkyl group; a $C_3$-$C_{12}$ aryl group, a $C_3$-$C_{12}$ cycloalkyl group, a $C_2$-$C_{12}$ alkenyl group, and a $C_2$-$C_{12}$ alkynyl group; $R^2$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting of from F, Cl, Br and I; wherein at least one or both of substituents $R^1$ and $R^2$ in the silicon-containing precursor and the $R^1$ and $R^2$ in the catalyst are the same and wherein the formulation does not change by greater than 10 wt % after being stored for six months.

14. A formulation for use in forming a silicon containing film comprising:
(a) a silicon-containing precursor comprising an alkoxyalkylsilane having a formula of $Si(OR^1)_nR^2_{4-n}$; and
(b) a catalyst comprising a haloalkoxyalkylsilane having a formula of $XSi(OR^1)_nR^2_{3-n}$; wherein $R^1$ is selected from the group consisting of a $C_1$-$C_{12}$ linear or branched alkyl group; a $C_3$-$C_{12}$ aryl group, a $C_3$-$C_{12}$ cycloalkyl group, a $C_2$-$C_{12}$ alkenyl group, and a $C_2$-$C_{12}$ alkynyl group; $R^2$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting 6 of 11 of from F, Cl, Br and I wherein at least one or both of substituents $R^1$ and $R^2$ in the silicon-containing precursor and the $R^1$ and $R^2$ in the catalyst are the same; wherein the formulation is a fluid and the concentration of the precursor or the catalyst do not compositionally change by more than 10% after storage for one year.

15. The formulation of claim 14 wherein $R^1$ is selected from the group consisting of methyl, ethyl, n-propyl, iso-propyl, tert-butyl, n-butyl, 2-ethylhexyl, isobutyl, sec-butyl, n-pentyl, isopentyl, neopentyl, tert-pentyl, n-hexyl, allyl (2-propenyl), homoallyl (3-butenyl), propargyl (2-propynyl), 2-hydroxyethyl, 2-hydroxypropyl, 2-methoxyethyl, phenyl, tolyl, xylyl, hydroxyphenyl, lauryl, napthyl, indenyl, benzyl, and mixtures thereof, and $R^2$ is selected from the group consisting of methyl, ethyl, n-propyl, isopropyl, n-butyl, 2-ethylhexyl, isobutyl, sec-butyl, n-pentyl, isopentyl, neopentyl, tert-pentyl, vinyl, allyl, homoallyl (3-butenyl), propargyl (2-propynyl), 2-hydroxyethyl, 2-hydroxypropyl, 2-methoxyethyl, phenyl, tolyl, xylyl, hydroxyphenyl, lauryl, napthyl, indenyl, benzyl, hydrogen and mixtures thereof.

16. The formulation of claim 14 wherein $R^1$ is selected from the group consisting of methyl, ethyl, iso-propyl, tert-butyl, phenyl, and mixtures thereof.

17. The formulation of claim 14 wherein $R^1$ is selected from the group consisting of methyl and ethyl; and X is Cl.

18. The formulation of claim 14 comprising at least one member selected from the group consisting of methyltriethoxysilane and chlorodiethoxymethylsilane (Cl-DEMS); bis(tert-butoxy)silane and bis(tert-butoxy)chlorosilane; methyltrimethoxysilane and methyldimethoxybromosilane; n-hexyltrimethoxysilane with methyldimethoxychlorosilane; and tetramethoxysilane with trimethoxychlorosilane.

19. The formulation of claim 14 wherein the formulation is stored in a container selected from the group consisting of glass, plastic, metallic, and plastic or glass lined metallic container.

20. A stable formulation for use in forming a silicon-containing film; selected from the group consisting of:
(1) a formulation comprising:
(a) a silicon-containing precursor comprising an alkoxyalkylsilane having a formula of $Si(OR^1)_nR^2_{4-n}$;
and (b) a catalyst comprising a haloalkoxyalkylsilane having a formula of $XSi(OR^1)_nR^2_{3-n}$; wherein $R^1$ is selected from the group consisting of a $C_1$-$C_{12}$ linear or branched alkyl group; a $C_3$-$C_{12}$ aryl group, a $C_3$-$C_{12}$ cycloalkyl group, a $C_2$-$C_{12}$ alkenyl group, and a $C_2$-$C_{12}$ alkynyl group; $R^2$ is selected from the group consisting of a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein when $R^1$ is methyl, $R^2$ is not hydrogen; n is an integer ranging from 1 to 4 inclusive; and X is selected from the group consisting of from F, Cl, Br and I and wherein at least one or both of substituents $R^1$ and $R^2$ in the silicon-containing precursor and the $R^1$ and $R^2$ in the catalyst are the same;
and
(2) a formulation comprising
(a) a silicon-containing precursor comprising a compound having a formula $R^2_{3-p}(R^1O)_p Si$—$R^3$—$Si(OR^1)_p R^2_{3-p}$
and
(b) a catalyst comprising a haloalkoxyalkylsilane having a formula of $(R^1O)_m R^2_{2-m}(X)Si$—$R^3$—$Si(OR^4)_2 R^5$; wherein $R^1$ and $R^4$ are each independently selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group;
and a $C_2$-$C_{12}$ alkynyl group; $R^2$ is selected from a $C_1$-$C_{12}$ linear or branched alkyl group; a $C_3$-$C_{12}$ aryl group; a $C_3$-$C_{12}$ cycloalkyl group; a $C_2$-$C_{12}$ alkenyl group; a $C_2$-$C_{12}$ alkynyl group; and a hydrogen atom; wherein $R^1$ and $R^2$ may be the same or different; $R^3$ is selected from a $C_{1-10}$ alkanediyl group; a $C_{2-10}$ alkenediyl group; a $C_{2-10}$ alkynediyl group; a $C_{3-10}$ cyclic alkanediyl; a $C_{5-10}$ cyclic alkenediyl group; a $C_{6-10}$ bi-cyclic alkanediyl group; a $C_{6-10}$ cyclic alkenediyl group; a $C_{6-10}$ arenediyl group; and $R^5$ is selected from a linear or branched $C_1$-$C_{12}$ alkyl group; a $C_4$-$C_{12}$ aryl group; a $C_3$-$C_{12}$ cycloalkyl group; a $C_2$-$C_{12}$ alkenyl group; a $C_2$-$C_{12}$ alkynyl group; and a linear or branched $C_1$-$C_{12}$ alkoxy group; X is chosen from F, Cl, Br and I; m is an integer ranging from 1 to 2 inclusive; and p is an integer ranging from 1 to 3 inclusive; wherein the stable formulation is reactive under chemical vapor conditions to form the silicon containing film.

21. The formulation of claim 20 wherein the process for forming the silicon containing film comprises a flowable chemical vapor deposition of silicon dioxide.

22. The formulation of claim 20 wherein the formulation is a fluid and the catalyst of formulation 1 or 2 reacts with at least one of water, ethanol or compositions thereof to generate HX wherein the concentration of HX is sufficient to accelerate hydrolysis of alkoxy groups in the silicon-containing precursor and catalyst in a process for forming the silicon containing film.

23. The formulation of claim 20 further comprising water.

24. The formulation of claim 1 wherein the formulation reacts with water under chemical vapor deposition conditions to deposit a silicon containing film.

25. The formulation of claim 13 wherein the formulation reacts with water under chemical vapor deposition conditions to deposit the silicon containing film.

26. The formulation of claim 14 wherein the formulation reacts with water under chemical vapor deposition conditions to deposit the silicon containing film.

* * * * *